(12) United States Patent
Tung

(10) Patent No.: US 6,391,698 B1
(45) Date of Patent: May 21, 2002

(54) FORMING COMPLEMENTARY METAL-OXIDE SEMICONDUCTOR WITH GRADIENT DOPED SOURCE/DRAIN

(75) Inventor: Ming-Tsung Tung, Hsin-Chu Shian (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/259,801

(22) Filed: Feb. 26, 1999

(51) Int. Cl.$^7$ .......................................... H01L 21/8238
(52) U.S. Cl. ...................... 438/199; 438/202; 257/332
(58) Field of Search ................................. 438/199, 270, 438/202, 586, 259, 137, 138; 257/332, 333, 389, 627, 628, 330

(56) References Cited

U.S. PATENT DOCUMENTS 5,077,228 A * 12/1991 Eklund et al. ............... 438/270

* cited by examiner

Primary Examiner—David Nelms
Assistant Examiner—Dung A. Le

(57) ABSTRACT

The present invention provides a method for forming a transistor with a gradient doped source/drain. The method comprises the following steps. First, two first N-wells are formed in a substrate and the first N-wells are separated in both sides of the substrate. The, two second N-wells are formed in the substrate and the second N-wells overlie the first N-wells. An implanting concentration of first N-wells is smaller than an implanting concentration of second N-wells. Next, a field oxide region is formed in the substrate between the first N-wells and the field oxide region overlies on a portion of second N-wells. Thereafter, portion of the field oxide region and the substrate are removed to form a trench n the substrate, wherein the remaining field oxide region overlies on the second N-wells. Next, a gate oxide layer is formed on a bottom surface and sidewall of the trench. Then, a polysilicon gate is formed on the substrate. The trenches filled with the polysilicon gate and the polysilicon gate overlies a portion of the remained field oxide region. Last, a $N^+$-type source/drain is formed in the substrate and the $N^+$-type source/drain is adjacent to the remaining field oxide region and overlies the second N-wells.

11 Claims, 2 Drawing Sheets

FORMING COMPLEMENTARY METAL-OXIDE SEMICONDUCTOR WITH GRADIENT DOPED SOURCE/DRAIN

BACKGROUND OF THE INVENTION

1. Field of the Invention

The present invention generally relates to the fabrication of semiconductor devices and specifically to a transistor device with a gradient doped source/drain and a method for forming the transistor device.

2. Description of the Prior Art

Integration of the integrated circuit semiconductor device has gradually increased. The size of the semiconductor device is shorter and shorter as well. Therefore, it is important to maintain good operative condition even though the size of the semiconductor is measured in amounts as small as angstroms. This is particularly true in the case of the conventional C.M.O.S. device, which is usually used as a high-voltage device. Generally the conventional horizontal-direction C.M.O.S. structure will occupy much space of the chip due. Also, the channel and drift area of the conventional C.M.O.S. will occupy the horizontal-direction space of chip. Therefore, if possible, it is necessary to modify the geometry of C.M.O.S. device.

One approach to minimize the degradation is to reduce the electric field at the drain region from achieving sufficient energy to be injected into the gate oxide. This is achieved by grading the junction of the drain by doing two implants and is designed to create a lighter doped region beyond the normal $N^+$ drain region. Also, this can be done by offsetting the heavier implant with a sidewall spacer foxing the drain structure, sometimes which is called a lightly doped drain (LDD).

Another approach is simply to do two implants of phosphorus and arsenic in the same region to form a structure which is sometimes called a double doped (or double diffused) drain (DDD). The electric field in the drain region is reduced for both these structures due to the graded drain doping.

SUMMARY OF THE INVENTION

In accordance with the present invention, a method is provided for forming Complementary Metal-Oxide Semiconductor that is substantially achieved. In one embodiment, an improved C.M.O.S. fabrication process which uses separate masking steps to pattern N-channel and P-channel transistor gates from a single layer of conductivity-doped polycrystalline silicon (polysilicon) and multi gradientially conductivity-doped.

The present invention provides a method for forming a transistor with a gradient doped source/drain. The method comprises the following steps. First, two N-wells are formed in a substrate and first N-wells are separated in both sides of the substrate. Then, two second N-wells are formed in the substrate and second N-wells overlie first N-wells. An implanting concentration of first N-wells is smaller than an implanting concentration of second N-wells. Next, a field oxide region is formed in the substrate between first N-wells and the field oxide region overlies a portion of second N-wells. Thereafter, a portion of the field oxide region and the substrate are removed to form a trench in the substrate, wherein the remaining field oxide region overlies the second N-wells. Next, a gate oxide layer is formed on a bottom surface and a sidewall of the trench. Then, a polysilicon gate is formed on the substrate. The trench is filled with the polysilicon gate and the polysilicon gate overlies a portion of the remaining field oxide region. Last, a $N^+$-type source/drain is formed in the substrate and the $N^+$-type source/drain is adjacent to the remained field oxide region and overlies the second N-wells.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment. Also, preferred embodiments of the present invention will be described hereinunder in detail with reference to the accompanying drawings.

FIG. 1A to 1G are sectional views showing in combination a first embodiment of the process for forming a transistor with a gradient doped source/drain, such as a high voltage device, according to the present invention.

Figure 1A:
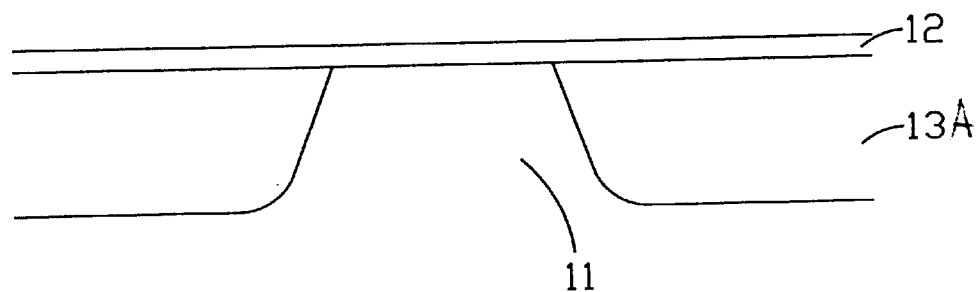
FIGS. 1A to 1G are sectional views showing in combination an embodiment of the present invention.

FIG. 1A shows a formed in such a manner that a silicon oxide 12 is provided by a known thermal oxidation method on a P substrate 11. This depth of oxide layer is about 1000 angstroms to 3000 angstroms. Only a part of the substrate named as active area, N-well 1 mask, is defined using a known processing technique such as photolithography. Next, the N-well 1, 13A, is doped using an implant method. The final parameter is about 3E15 to 2E16 $1/cm^3$. Sequentially N-well 1, 13A, is driven in the substrate by thermal diffusion method. The N-well 1, 13A is seperated in both sides of the substrate.

Figure 1B:
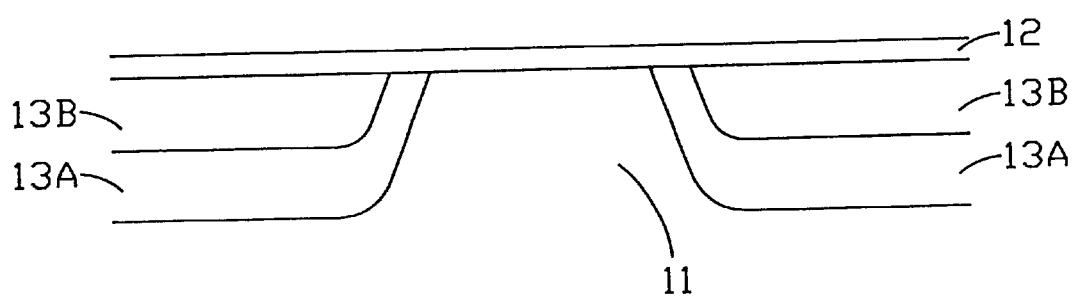

As shown in FIG. 1B, N-well 2, 13B, is then formed as a second conductor layer by N-well mask defining and then implanting by the same technique, an implant method. A continuous drive-in process is carried out using the thermal diffusion method. Its final doping parameter for the implanting process is about 2E16 to 2E17 $1/cm^3$. The N-well 2, 13B overlies the N-well 1, 13A. The implanting concentration of the N-well 1, 13A is smaller than the implanting concentration of the N-well 1, 13B.

Figure 1C:
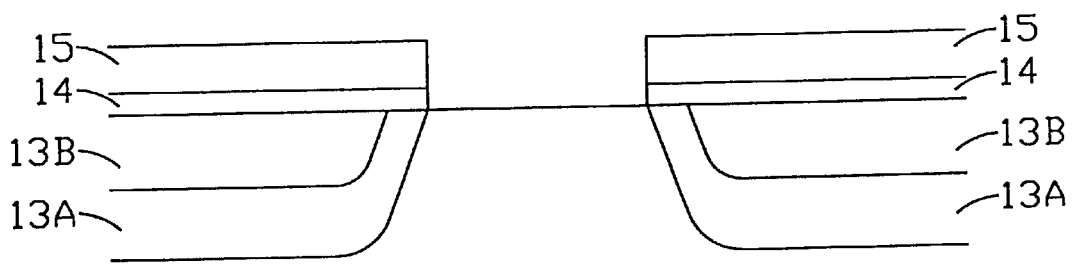

FIG. 1C illustrates the original silicon oxide layer 12 having been removed, and then pad oxide layer 14 on the top surface is formed using a thermal oxidation method. Then, nitride deposition 15 is sequentially formed using L.P.C.V.D. (Low Pressure Chemical Vapor Deposition) method as silicon nitride 15 and its depth is about 100 angstroms to 300 angstroms. Consequentially about 100 angstroms to 200 angstroms of the pad oxide 14 is removed by photolithography method. Next, a portion of pad oxide layer 13 and a portion of Silicon Nitride 15 are removed to form an opening. The opening exposes the substrate 11 between the N-well 1, 13A.

Figure 1D:
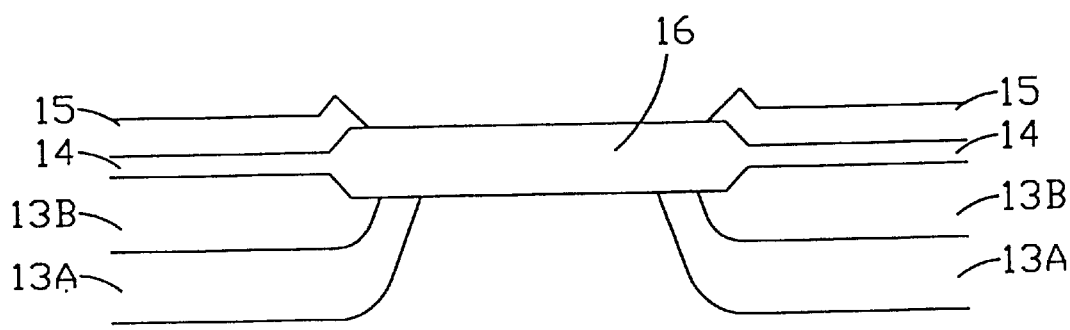

As FIG. 1D shows, a field oxide region 16 is sequentially formed in the substrate of the opening by using L.P.C.V.D. (Low Pressure Chemical Vapor Deposition) method as and its depth is about 3000 angstroms to 10000 angstroms. The field oxide region 16 is formed betweeen the N-well 1, 13A and the field oxide region 16 overlies a portion of the N-well 2, 13B.

Figure 1E:
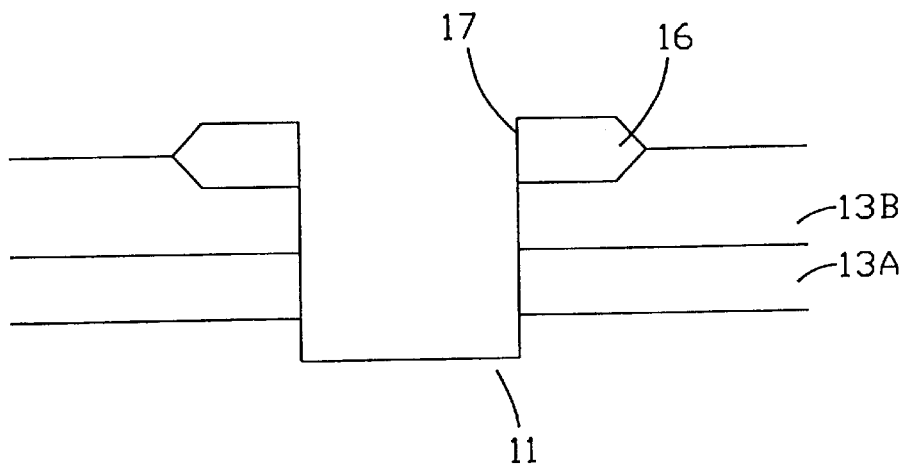

Then, as shown in FIG. 1E, silicon nitride 15 and the pad oxide layer 16 are removed, respectively. After the trench mask is defined, trench 17 is longer over than N-well 1, 13A and N-well 2, 13B will be obtained by a known trench isolation method. The trench 17 is formed by removing a portion of the field oxide region 16 and the substrate. The remained field oxide region overlies the N-well 2, 13B. Here, trench isolation method is employed a processing method which enables completely non-isotropic etching.

Figure 1F:
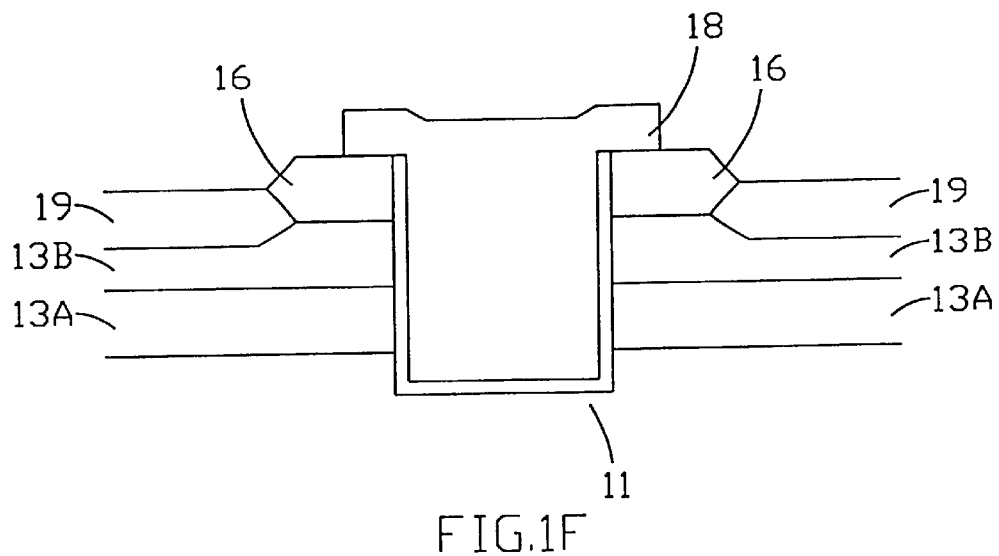
Figure 1G:
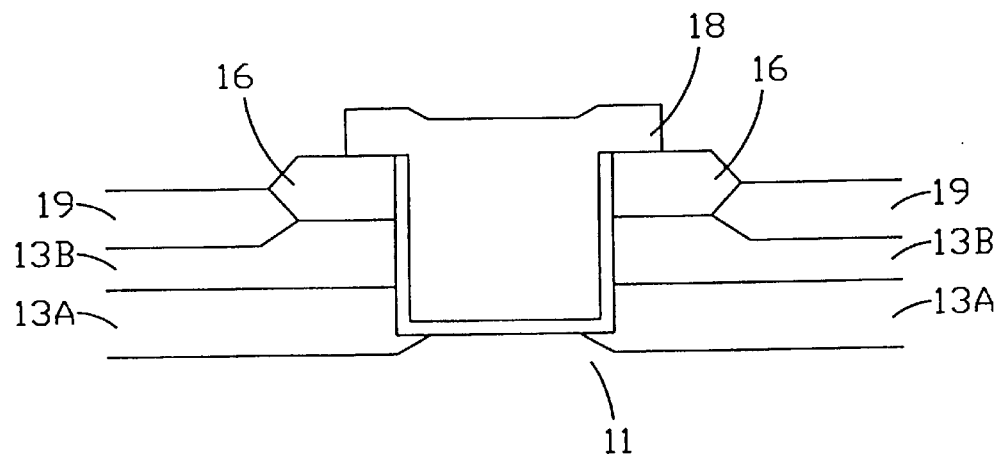

As shown in FIG. 1F, polysilicon 18 is deposited and refilled on the above trench by using L.P.C.V.D. method. Consequentially $N^+$-type doped polysilicon 18 is then carried out by thermal diffusion or an implant method. After the gate mask is defined, the $N^+$-type doped polysilicon 18 is used as a polysilicon gate electrode and overlies a portion of the remaining field oxide region 16. Before the formation of the polysilicon 18, a gate oxide layer 18A is formed on a bottom surface and a sidewall of the trench 17. Here, the depth of the gate oxide layer 18A is about 300 angstroms to 1000 angstroms. Therefore, finally again, $N^+$-type source/drain of transistor will be formed entirely, as FIG. 1F. Referring to FIG. 1G, the difference with FIG. 1F is the depth of the trench 17. The trench 17 is not deeper than the N-well 1, 13A, as a result of different trench ilsolation processes.

To sum up the foregoing, different concentration of the N-well 1 and N-well 2 are used to be a gradient doping of the drift region. The gradient doping can raise the ability of driving current and reach the need for a high voltage. Furthermore, because the channel region and the drift region are located in a vertical position using a trench for the gate electrode, the transistor with a gradient doped source/drain can effectively reduce the chip area.

Although specific embodiments have been illustrated and described, it will be obvious to those skilled in the art that various modifications may be made without departing from what is intended to be limited solely by the appended claims.

What is claimed is:

1. A method for forming a transistor with a gradient doped source/drain, said method comprising:

providing a substrate;

forming two first N-wells in said substrate, wherein said first N-wells are separated in both sides of said substrate;

forming two second N-wells in said substrate, wherein said second N-wells overlie said first N-wells, wherein an implanting concentration of said first N-wells is smaller than an implanting concentration of said second N-wells;

forming a field oxide region in said substrate between said first N-wells, wherein said field oxide region overlies on a portion of said second N-wells;

removing a portion of said field oxide region and said substrate to form a trench in said substrate, wherein said remained field oxide region overlies on said second N-wells;

forming a gate oxide layer on a bottom surface and a sidewall of said trench;

forming a polysilicon gate on said substrate, wherein said trench is filled with said polysilicon gate and said polysilicon gate overlies on a portion of said remained field oxide region; and forming a $N^+$-type source/drain in said substrate, wherein said $N^+$-type source/drain is adjacent to said remained field oxide region and overlies said second N-wells.

2. The method according to claim 1, further comprising a step of forming an oxide layer on said substrate before forming said first N-wells.

3. The method according to claim 2, wherin a thickness of said oxide layer is about 1000 to 3000 angstroms.

4. The method according to claim 1, wherein said field oxide region is formed by following steps:

forming a pad oxide layer on a surface of said substrate;

forming a nitride layer on said pad oxide layer;

removing a portion of said nitride layer and said pad oxide layer to form an opening to expose said substrate between said first N-wells;

forming said field oxide region in said substrate of said opening; and removing said nitride layer and said pad oxide layer.

5. The method according to claim 4, wherein a thickness of said pad oxide layer is about between 100 to 200 angstroms.

6. The method according to claim 4, wherein a thickness of said nitride layer is about between 100 t0 300 angstroms.

7. A method for forming a transistor with a gradient doped source/drain, said method comprising:

providing a substrate;

forming two first N-wells in said substrate, wherein said first N-wells are separated in both sides of said substrate;

forming two second N-wells in said substrate, wherein said second N-wells overlie said first N-wells, wherein an implanting concentration of said first N-wells is smaller than an implanting concentration of said second N-wells;

forming a pad oxide layer on a surface of said substrate;

forming a nitride layer on said pad oxide layer;

removing a portion of said nitride layer and said pad oxide layer to form an opening, wherein said opening at least exposes said substrate between said separated first N-wells;

forming a field oxide region in said substrate of said opening, wherein said field oxide region overlies on a portion of said second N-wells;

removing said nitride layer and said pad oxide layer;

removing a portion of said field oxide region and said substrate to form a trench in said substrate, wherein said remained field oxide region overlies on said on said second N-wells;

forming a gate oxide layer on a bottom surface and a sidewall of said trench;

forming a polysilicon gate on said substrate, wherein said trench is filled with said polysilicon gate and said polysilicon gate overlies on a portion of said remained field oxide region; and forming a $N^+$-type source/drain in said substrate, wherein said $N^+$-type source/drain is adjacent to said remained field oxide region and overlies said second N-wells.

8. The method according to claim 7, further comprising a step of forming an oxide layer on said substrate before forming said first N-wells.

9. The method according to claim 8, wherein a thickness of said pad oxide layer is about between 1000 to 3000 angstroms.

10. The method according to claim 7, wherein a thickness of said pad oxide layer is about between 100 to 200 angstroms.

11. The method according to claim 7, wherein a thickness of said nitride layer is about between 100 to 300 angstroms.

* * * * *